United States Patent
Willmot et al.

(10) Patent No.: US 9,204,497 B2
(45) Date of Patent: Dec. 1, 2015

(54) ELECTRICAL STRUCTURE HAVING A GROUNDING PLANE

(71) Applicant: ROLLS-ROYCE PLC, London (GB)

(72) Inventors: Michael Christopher Willmot, Sheffield (GB); John Philip Richardson, Derby (GB); Jason Watkiss, Leicester (GB); Paul Broughton, Leicester (GB); Richard Peace, Derby (GB); Gary Alan Skinner, Nottingham (GB); Robin Charles Kennea, Nottingham (GB)

(73) Assignee: ROLLS-ROYCE PLC, London (GB)

(*) Notice: Subject to any disclaimer, the term of this patent is extended or adjusted under 35 U.S.C. 154(b) by 365 days.

(21) Appl. No.: 13/716,300

(22) Filed: Dec. 17, 2012

(65) Prior Publication Data

US 2013/0264110 A1   Oct. 10, 2013

(30) Foreign Application Priority Data

Dec. 22, 2011 (GB) .................................. 1122140.5
Dec. 22, 2011 (GB) .................................. 1122143.9
Mar. 7, 2012 (GB) .................................. 1203991.3
Jul. 10, 2012 (GB) .................................. 1212221.4

(51) Int. Cl.
*H02G 3/02* (2006.01)
*H02G 1/00* (2006.01)
(Continued)

(52) U.S. Cl.
CPC . *H05B 3/28* (2013.01); *B23P 6/005* (2013.01); *F02C 7/00* (2013.01); *F02C 7/047* (2013.01); *F02C 7/12* (2013.01); *F02C 7/20* (2013.01); *F02C 7/224* (2013.01); *F02C 7/32* (2013.01); *F24H 1/105* (2013.01); *H01R 12/00* (2013.01);
(Continued)

(58) Field of Classification Search
USPC ......................................................... 174/68.1
See application file for complete search history.

(56) References Cited

U.S. PATENT DOCUMENTS 2,523,083 A * 9/1950 Witkowski ..................... 439/382
2,877,544 A   3/1959 Gammel
(Continued)

FOREIGN PATENT DOCUMENTS

DE   2941950 B1   2/1981
EP   1741879 A1   1/2007
(Continued)

OTHER PUBLICATIONS

Apr. 20, 2012 Search Report issued in British Patent Application No. GB1122140.5.
(Continued)

*Primary Examiner* — Timothy Thompson
*Assistant Examiner* — Michael F McAllister
(74) *Attorney, Agent, or Firm* — Oliff PLC

(57) ABSTRACT

An electrical assembly including electrical raft having electrical conductors embedded in a rigid material is provided. The electrical assembly has an electrically conductive screen layer. The electrically conductive screen layer provides electromagnetic protection to the electrical conductors. The electrically conductive screen layer is electrically connected to a mounting fixture, which in turn may be electrically connected to an apparatus on which the electrical assembly may be mounted. The electrical raft is used to transport electrical signals (which may be, for example power and/or control signals), for example around a gas turbine engine.

20 Claims, 8 Drawing Sheets

(51) Int. Cl.
    *H05B 3/28*       (2006.01)
    *F02C 7/12*       (2006.01)
    *F02C 7/20*       (2006.01)
    *B23P 6/00*       (2006.01)
    *H02G 3/04*       (2006.01)
    *H01R 12/00*      (2006.01)
    *F02C 7/00*       (2006.01)
    *F02C 7/32*       (2006.01)
    *F02C 7/047*      (2006.01)
    *F02C 7/224*      (2006.01)
    *F24H 1/10*       (2006.01)
    *H05B 1/02*       (2006.01)
    *H01B 7/08*       (2006.01)

(52) U.S. Cl.
    CPC . *H02G 1/00* (2013.01); *H02G 3/02* (2013.01);
    *H02G 3/04* (2013.01); *H05B 1/0236* (2013.01);
    *Y02T 50/672* (2013.01); *Y10T 29/49002*
    (2015.01); *Y10T 29/49117* (2015.01); *Y10T*
    *29/49234* (2015.01); *Y10T 29/49236* (2015.01);
    *Y10T 29/49238* (2015.01); *Y10T 156/10*
    (2015.01)

(56) References Cited

U.S. PATENT DOCUMENTS

| | | | |
|---|---|---|---|
| 3,128,214 A | 4/1964 | Lay | |
| 3,284,003 A | 11/1966 | Ciemochowski | |
| 3,494,657 A | 2/1970 | Harper et al. | |
| 3,612,744 A * | 10/1971 | Thomas | 174/36 |
| 3,700,825 A * | 10/1972 | Taplin et al. | 174/36 |
| 3,710,568 A | 1/1973 | Rice | |
| 4,137,888 A | 2/1979 | Allan | |
| 4,149,567 A | 4/1979 | Weirich | |
| 4,220,912 A | 9/1980 | Williams | |
| 4,488,970 A | 12/1984 | Clark | |
| 4,671,593 A | 6/1987 | Million-Fremillon et al. | |
| 5,004,639 A * | 4/1991 | Desai | 428/138 |
| 5,031,396 A | 7/1991 | Margnelli | |
| 5,091,605 A | 2/1992 | Clifford | |
| 5,138,784 A | 8/1992 | Niwa | |
| 5,142,448 A * | 8/1992 | Kober et al. | 361/751 |
| 5,174,110 A * | 12/1992 | Duesler et al. | 60/226.1 |
| 5,249,417 A | 10/1993 | Duesler et al. | |
| 5,435,124 A | 7/1995 | Sadil et al. | |
| 5,688,145 A | 11/1997 | Liu | |
| 5,692,909 A * | 12/1997 | Gadzinski | 439/34 |
| 5,795,172 A | 8/1998 | Shahriari et al. | |
| 5,870,824 A | 2/1999 | Lilja et al. | |
| 5,876,013 A | 3/1999 | Ott | |
| 5,885,111 A | 3/1999 | Yu | |
| 5,895,889 A | 4/1999 | Uchida et al. | |
| 6,050,853 A | 4/2000 | Ando et al. | |
| 6,157,542 A | 12/2000 | Wu | |
| 6,399,889 B1 | 6/2002 | Korkowski et al. | |
| 6,434,473 B1 | 8/2002 | Hattori | |
| 6,481,101 B2 | 11/2002 | Reichinger | |
| 6,588,820 B2 | 7/2003 | Rice | |
| 6,689,446 B2 | 2/2004 | Barnes et al. | |
| 6,702,607 B2 | 3/2004 | Kondo | |
| 6,969,807 B1 * | 11/2005 | Lin et al. | 174/117 F |
| 6,971,650 B2 | 12/2005 | Marelja | |
| 6,971,841 B2 | 12/2005 | Care | |
| 7,002,269 B2 | 2/2006 | Angerpointer | |
| 7,010,906 B2 | 3/2006 | Cazenave et al. | |
| 7,232,315 B2 | 6/2007 | Uchida et al. | |
| 7,281,318 B2 | 10/2007 | Marshall et al. | |
| 7,389,977 B1 | 6/2008 | Fernandez et al. | |
| 7,414,189 B2 | 8/2008 | Griess | |
| 7,500,644 B2 | 3/2009 | Naudet et al. | |
| 7,506,499 B2 | 3/2009 | Fert et al. | |
| 7,516,621 B2 * | 4/2009 | Suttie et al. | 60/796 |
| 7,525,816 B2 | 4/2009 | Sawachi | |
| 7,543,442 B2 | 6/2009 | Derenes et al. | |
| 7,661,272 B2 | 2/2010 | Gagneux et al. | |
| 7,745,730 B2 | 6/2010 | Bailey | |
| 7,762,502 B2 | 7/2010 | Mesing et al. | |
| 7,837,497 B1 | 11/2010 | Matsuo et al. | |
| 7,862,348 B2 | 1/2011 | Strauss | |
| 8,038,104 B1 | 10/2011 | Larkin | |
| 8,137,524 B2 | 3/2012 | Berggren et al. | |
| 8,317,524 B2 | 11/2012 | Bailey | |
| 8,491,013 B2 | 7/2013 | Peer et al. | |
| 8,581,103 B2 | 11/2013 | Aspas Puertolas | |
| 8,794,584 B2 | 8/2014 | Shimada et al. | |
| 8,937,254 B2 | 1/2015 | Wen et al. | |
| 9,010,716 B2 | 4/2015 | Kobori | |
| 9,040,821 B2 | 5/2015 | Blanchard et al. | |
| 2002/0086586 A1 | 7/2002 | Shi et al. | |
| 2002/0170729 A1 * | 11/2002 | Murakami et al. | 174/35 R |
| 2003/0095389 A1 * | 5/2003 | Samant et al. | 361/749 |
| 2003/0155467 A1 | 8/2003 | Petrenko | |
| 2004/0065092 A1 | 4/2004 | Wadia et al. | |
| 2004/0266266 A1 | 12/2004 | Lai | |
| 2004/0266274 A1 | 12/2004 | Naudet et al. | |
| 2006/0272340 A1 | 12/2006 | Petrenko | |
| 2006/0278423 A1 | 12/2006 | Ichikawa et al. | |
| 2007/0029454 A1 | 2/2007 | Suttie et al. | |
| 2007/0084216 A1 | 4/2007 | Mazeaud et al. | |
| 2007/0129902 A1 | 6/2007 | Orbell | |
| 2008/0128048 A1 | 6/2008 | Johnson et al. | |
| 2008/0179448 A1 | 7/2008 | Layland et al. | |
| 2008/0185478 A1 | 8/2008 | Dannenberg | |
| 2008/0245932 A1 | 10/2008 | Prellwitz et al. | |
| 2009/0189051 A1 | 7/2009 | Love | |
| 2009/0230650 A1 | 9/2009 | Mayen et al. | |
| 2009/0242703 A1 | 10/2009 | Alexander et al. | |
| 2009/0277578 A1 * | 11/2009 | Sung et al. | 156/285 |
| 2009/0289232 A1 * | 11/2009 | Rice | 252/511 |
| 2010/0162726 A1 | 7/2010 | Robertson et al. | |
| 2010/0261365 A1 | 10/2010 | Sakakura | |
| 2010/0308169 A1 | 12/2010 | Blanchard et al. | |
| 2011/0011627 A1 | 1/2011 | Aspas Puertolas | |
| 2011/0016882 A1 | 1/2011 | Woelke et al. | |
| 2011/0017879 A1 | 1/2011 | Woelke et al. | |
| 2011/0053468 A1 | 3/2011 | Vontell | |
| 2011/0111616 A1 | 5/2011 | Chang et al. | |
| 2011/0120748 A1 | 5/2011 | Bailey | |
| 2011/0315830 A1 | 12/2011 | Eshima et al. | |
| 2012/0012710 A1 | 1/2012 | Yamaguchi et al. | |
| 2012/0103685 A1 | 5/2012 | Blanchard et al. | |
| 2012/0111614 A1 | 5/2012 | Free | |
| 2012/0149232 A1 | 6/2012 | Balzano | |
| 2012/0312022 A1 | 12/2012 | Lam et al. | |
| 2013/0189868 A1 | 7/2013 | Fitt et al. | |
| 2013/0316147 A1 | 11/2013 | Douglas et al. | |

FOREIGN PATENT DOCUMENTS

| | | |
|---|---|---|
| EP | 1 760 291 A2 | 3/2007 |
| EP | 1 762 714 A2 | 3/2007 |
| EP | 2279852 A1 | 2/2011 |
| EP | 2 590 270 A2 | 5/2013 |
| FR | 2871284 A1 | 12/2005 |
| GB | 1260339 A | 1/1972 |
| GB | 2152147 A | 7/1985 |
| GB | 2477337 A | 8/2011 |
| JP | A-63-285808 | 11/1988 |
| JP | A-4-167376 | 6/1992 |
| JP | A-4-223067 | 8/1992 |
| JP | A-5-129040 | 5/1993 |
| JP | A-2000-299151 | 10/2000 |
| WO | 2009/118561 A1 | 10/2009 |
| WO | WO 2010/075390 A2 | 7/2010 |
| WO | WO 2011/061074 A1 | 5/2011 |
| WO | WO 2011/117609 | 9/2011 |
| WO | WO 2011/127996 A1 | 10/2011 |

OTHER PUBLICATIONS

Apr. 19, 2012 Search Report issued in British Patent Application No. GB1122143.9.

(56) References Cited

OTHER PUBLICATIONS

Jun. 21, 2012 Search Report issued in British Patent Application No. GB1203991.3.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Broughton et al., Pending U.S. Appl. No. 13/716,648, filed Dec. 17, 2012.
Broughton et al., Pending U.S. Appl. No. 13/716,439, filed Dec. 17, 2012.
Broughton et al., Pending U.S. Appl. No. 13/716,254, filed Dec. 17, 2012.
Willmot et al., Pending U.S. Appl. No. 13/716,497, filed Dec. 17, 2012.
Willmot et al., Pending U.S. Appl. No. 13/716,239, filed Dec. 17, 2012.
Broughton et al., Pending U.S. Appl. No. 13/716,587, filed Dec. 17, 2012.
Maszczk et al., Pending U.S. Appl. No. 13/716,796, filed Dec. 17, 2012.
Willmot et al., Pending U.S. Appl. No. 13/716,808, filed Dec. 17, 2012.
Broughton et al., Pending U.S. Appl. No. 13/716,708, filed Dec. 17, 2012.
Dalton et al., Pending U.S. Appl. No. 13/716,244, filed Dec. 17, 2012.
Broughton et al., Pending U.S. Appl. No. 13/716,503, filed Dec. 17, 2012.
Broughton et al., Pending U.S. Appl. No. 13/716,516, filed Dec. 17, 2012.
Jun. 5, 2015 Office Action issued in U.S. Appl. No. 13/716,708.
Fitt et al., Pending U.S. Appl. No. 13/792,851, filed Mar. 11, 2013.
Aug. 15, 2014 Office Action issued in U.S. Appl. No. 13/716,497.
Nov. 20, 2014 Office Action issued in U.S. Appl. No. 13/716,648.
Apr. 23, 2014 European Search Report issued in European Patent Application No. 12 19 7402.
Apr. 24, 2014 European Search Report issued in European Patent Application No. 13 19 5848.
Aug. 5, 2013 Search Report issued in British Patent Application No. 1308033.8.
Oct. 25, 2013 European Search Report issued in European Patent Application No. 13 15 8531.
Broughton et al., U.S. Appl. No. 14/100,745, filed Dec. 9, 2013.
Jun. 12, 2015 Office Action in U.S. Appl. No. 13/716,254.
Feb. 25, 2015 Office Action issued in U.S. Appl. No. 13/716,497.
Apr. 6, 2015 Office Action issued in U.S. Appl. No. 13/716,648.
Jun. 19, 2015 Office Action issued in U.S. Appl. No. 13/716,244.
Nellis and Klein, "Heat Transfer", 2009, Campridge University, pp. 748-751.
Jul. 29, 2015 Office Action issued in U.S. Appl. No. 13/716,648.
Jul. 28, 2015 Office Action issued in U.S. Appl. No. 13/716,796.
Jul. 17, 2015 Office Action issued in U.S. Appl. No. 13/716,497.
Aug. 13, 2015 Office Action issued in U.S. Appl. No. 13/716,516.
Aug. 27, 2015 Office Action issued in U.S. Appl. No. 13/792,851.
Sep. 4, 2015 Office Action issued in U.S. Appl. No. 13/716,503.

* cited by examiner

ELECTRICAL STRUCTURE HAVING A GROUNDING PLANE

This application is based upon and claims the benefit of priority from British Patent Application Number 1122140.5 filed 22 Dec. 2011, British Patent Application Number 1122143.9 filed 22 Dec. 2011, British Patent Application Number 1203991.3 filed 7 Mar. 2012 and British Patent Application Number 1212221.4 filed 10 Jul. 2012, the entire contents of which are incorporated by reference.

BACKGROUND OF THE INVENTION

1. Field of the Invention

This invention relates to electrical protection of conductors and components of a rigid electrical assembly. In particular, aspects of the invention relate to using a conductive layer to protect electrical connectors used in rigid electrical rafts to distribute electrical signals around a gas turbine engine, and to protect electrical units mounted on the rigid electrical rafts.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding.

Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

The electrical conductors in the conventional harnesses may be susceptible to electromagnetic damage and/or interference. For example, the electrical conductors may interfere with each other. This may mean that electrical signals may suffer unwanted and unknown changes as they pass along the conductors. Additionally or alternatively, electrical damage and/or interference may be caused by electrical surges, for example due to lightening strikes. In order to try to avoid/minimize this potential damage/interference, individual wires and/or bundles in the conventional electrical harness may be provided with sleeving and/or braiding. This adds significant weight to the harness, and thus to the engine. The weight gain may be particularly significant where many separate sleeves and/or braids need to be applied to individual wires and/or only small collections of wires.

Electromagnetic damage and/or interference may also occur to electrical units (such as electronic control units) mounted on a gas turbine engine, for example due to lightening strikes. Such damage could be extremely serious, and so protection is required. Conventionally, therefore, an electrical grounding path is provided from the electrical units to the rest of the engine. This may take the form of electrical connection of the casing of the electrical unit to an electrically conductive component mounted on the engine. The electrical protection of the electrical units is provided separately from the electrical protection of the electrical conductors in the conventional harness. This adds complexity (for example in terms of part count) and weight to the engine, and also adds to the assembly time.

OBJECTS AND SUMMARY OF THE INVENTION

According to an aspect, there is provided an electrical raft assembly having an electrical raft. The electrical raft comprises a rigid material having multiple (a plurality of) electrical conductors embedded therein. The electrical raft also comprises an electrically conductive screen layer. The electrical raft assembly further comprises a mounting fixture for attaching the electrical raft assembly to another component, which other component may be referred to as a mounting structure of an apparatus. The mounting fixture is in electrical contact with the electrically conductive screen layer. The mounting fixture may be arranged so as to be in electrical contact with the mounting structure when attached thereto. Accordingly, the electrically conductive screen layer may be in electrical connection with the apparatus when the electrical raft assembly is mounted thereto (for example via the mounting fixture). A part of the mounting fixture may be, for example, in direct electrical contact with a part of the electrically conductive screen layer and/or a connection element attached to or integral with the electrically conductive screen layer.

According to this arrangement, multiple electrical conductors, which may be used to transmit electrical signals of any type (including, but not limited to, control signals and electrical power), may be provided in a single rigid structure. The rigid structure may provide mechanical protection to each (for example all) of the multiple conductors, for example due to being resistant to breaking and/or snapping and/or piercing and/or puncturing. Purely by way of example, the use of electrical rafts may reduce, or substantially eliminate, the chance of foreign bodies coming into contact with the electrical conductors, for example through fluid ingress. The electrically conductive screen layer may provide electrical protection (for example an electromagnetic shield) to each (for example all) of the multiple conductors. In other words, the electrically conductive screen layer may be constructed and/or arranged to provide electrical (and optionally mechanical) protection to at least some (for example all) of the embedded electrical conductors. Thus, separate mechanical and/or electrical protection is not required for each conductor, as would be the case for a conventional electrical harness, because the electrical raft described above provides both electrical and mechanical protection. The electrical raft assembly can therefore be lighter, easier to assemble and/or handle and more compact, and/or may provide better mechanical and/or electrical protection to the electrical conductors, for example compared with a conventional harness arrangement. Furthermore, it will be apparent that the rigid electrical raft may take any shape, as desired. Thus, the rigid electrical raft may be shaped to conform to other parts of an apparatus to which it may be attached (for example, a part of a gas turbine engine, such as a fan case). Other advantages of this arrangement will also be apparent, at least some of which are described elsewhere herein.

The electrically conductive screen layer may be at least partially embedded in the rigid material. In some arrangements, all of the electrically conductive screen layer may be embedded in the rigid material. The rigid raft may thus provide mechanical protection to the embedded portion. At least a part of the electrically conductive screen layer may be exposed at a surface of the electrical raft. The exposed portion may be available for electrical connection to other components and/or to the mounting fixture. The electrically conductive screen may be provided with a separate protective layer, by which it may be at least partially covered/surrounded.

The rigid electrical raft may be said to be a thin, or elongate, member, which may be said to have an upper major surface and a lower major surface separated by a raft thickness. The electrically conductive screen layer may be substantially aligned with (for example substantially parallel to) the upper and/or lower major surfaces of the electrical raft. As described elsewhere herein, at least some of the electrical conductors may also be aligned in rows (for example in the form of a flexible printed circuit, or FPC). In such cases, the rows of conductors may also be aligned with the electrically conductive screen layer and/or the upper and lower major surfaces of the electrical raft. The electrically conductive screen layer may extend across a part, or all, of the electrical raft.

The electrically conductive screen layer may take any suitable form. For example, the electrically conductive screen layer may be a mesh. The electrically conductive screen layer may be metallic, for example comprising copper or any other suitable metal. Thus, by way of example only, the electrically conductive screen layer may be a copper mesh.

The electrical raft (and thus electrical raft assembly) may comprise one or more than one electrically conductive screen layer(s). For example, the electrical raft may comprise two electrically conductive screen layers. The electrical conductors (or at least some of the electrical conductors) may be provided between two electrically conductive screen layers in such an arrangement. However, the electrical raft may of course comprise just one electrically conductive screen layer.

The electrical raft may comprise one or more electrical connectors or sockets, which may be electrically connected to at least one of the embedded electrical conductors. The electrical connector or socket may allow electrical connection of the electrical raft to other electrical components, for example to other electrical rafts (either directly or indirectly, via an electrical cable or lead) or to electrical units (again, either directly or indirectly, via an electrical cable or lead). Such an electrical connector or socket may take any suitable form, and may be embedded in the rigid electrical raft.

The electrical raft assembly may further comprise an electrical unit mounted to the electrical raft. The electrical unit may have a casing. At least a part of (for example all of or part of) the casing may be electrically conductive. The casing of the electrical unit may be electrically connected to the electrically conductive screen layer. The electrical connection between the electrical unit and the electrically conductive screen layer may be either direct (for example by direct physical contact) or indirect (for example via other components). Examples of the electrical connection between the electrical unit and the electrically conductive screen layer are provided elsewhere herein.

According to such an arrangement, the electrically conductive screen layer may act as a ground plane (or earth plane or reference plane) for the electrical unit mounted on the electrical raft. The electrically conductive screen layer may allow the electrical unit to be "earthed", and thus electrically protected, for example from excessive voltage, which may be caused by lightning strike. For example, the electrical unit may be in electrical contact with the mounting fixture via the electrically conductive screen layer. Thus, when the mounting fixture is attached to another apparatus (for example via a mounting structure, such as a mounting flange, of a gas turbine engine) an electrical path may be provided from the electrical unit to the other apparatus, for example via the electrically conductive screen layer and the mounting fixture, thereby allowing the electrical unit to be grounded.

Thus, the electrically conductive screen layer may act both as an electromagnetic shield for the embedded electrical conductors and as a ground plane (or grounding path) for an electrical unit which may be mounted on the electrical raft.

The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). At least one (i.e. one or more) electrical unit may be attached to an electrical raft.

Such an electrical raft assembly may be a particularly convenient, lightweight and/or compact way of providing (for example attaching, fixing or mounting) an electrical unit to a turbine engine. For example, the electrical unit and the electrical raft may be assembled together (mechanically and/or electrically) before being installed on the gas turbine engine, as described elsewhere herein.

The electrical raft may comprise an electrical contact region in which the electrically conductive screen layer is exposed at the surface of the electrical raft. The exposed region may be referred to as a contact region. In examples having an electrical unit mounted on the electrical raft, the electrical unit may be mounted to the electrical raft such that an electrically conductive portion of the casing is in direct contact with the electrically conductive screen layer at the electrical contact region. This may be a particularly convenient and simple arrangement for ensuring robust electrical connection of the electrical unit to the electrically conductive screen layer.

The electrical raft may comprise an opening having an electrically conductive (for example metallic) insert. The opening may be in the form of a through-hole passing entirely though the electrical raft, for example from an upper major surface through to a lower major surface. The electrically conductive insert may be electrically joined to the electrically conductive screen layer. The electrical joining may take any suitable form including, by way of example only, brazing, soldering and/or welding. In examples having an electrical unit mounted on the electrical raft, the electrical unit may be mounted to the electrical raft using an electrically conductive fastener that engages with an electrically conductive portion of the casing and is inserted into the opening so as to be in electrical contact with the electrically conductive insert. This may allow the electrical unit to be electrically connected to the electrically conductive screen layer without having to expose the electrically conductive screen layer outside the rigid material of the electrical raft. Alternatively, it may be used in combination with mounting the electrical unit directly on the electrically conductive screen layer so as to provide two separate methods of electrical connection.

Any type of electrically conductive insert and electrically conductive fastener may be used. For example, the electrically conductive insert may be a threaded insert, and the electrically conductive fastener may be a corresponding threaded fastener, such as a bolt or screw. The electrically conductive fastener may include other elements, such as a washer.

The mounting fixture may comprise an anti-vibration mount. The mounting fixture may also comprise a conductive strap fixed across the anti-vibration mount. Such a conductive strap may provide electrical connection across the anti-vibration mount. One end of the conductive strap may be attached (and thus electrically connected) to the electrically conductive screen layer on one side of the anti-vibration mount, and another end of the conductive strap may be attached (and thus electrically connected) to a conductive portion of the mounting fixture on the other side of the anti-vibration mount.

Accordingly, the mounting fixture may be in electrical contact with the electrically conductive screen layer through the electrically conductive strap. This may be an example of the mounting fixture being in indirect electrical contact with the electrically conductive screen layer. Such an electrically conductive strap may be flexible, or malleable. The mounting fixture may comprise one, or more than one (for example 2, 3, 4, 5 or more than 5) electrically conductive straps.

Such an arrangement may thus allow an anti-vibration mount to be incorporated into the electrical raft assembly, thereby allowing the electrical raft to be vibration isolated (or at least substantially vibration isolated) from the assembly to which the electrical raft assembly may be mounted. Using an anti-vibration mount to attach the electrical raft/assembly to the gas turbine engine may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For example, the reduced vibration may help to preserve the electrical contact between the electrical raft and the electrical unit connected thereto. As such, any components (such as an electrical unit mounted to the electrical raft) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

Such an anti-vibration mount may comprise a resilient core. The resilient core may be, for example, elastomeric. The resilient core may be sandwiched between upper and lower conductive surfaces. A first end of the or each conductive strap may be in electrical contact with the lower conductive surface of the anti-vibration mount, which itself may be in electrical contact with the electrically conductive screen layer. A second end of the or each conductive strap may be in electrical contact with the upper conductive surface of the anti-vibration mount.

In such an arrangement, the mounting fixture may comprise an electrically conductive raft fastener that passes through the electrical raft (for example entirely through). One end of the electrically conductive raft fastener may be in electrical contact with the second end of the conductive strap. Another end of the conductive raft fastener may extend through the electrical raft for connection with said mounting structure of said apparatus. As such, the electrically conductive raft fastener may allow the conductive strap, which is itself electrically connected to the electrically conductive screen layer, to be connected to another apparatus (e.g. to a mounting structure of another apparatus). The electrically conductive raft fastener may take any form, such as, by way of example only, a threaded fastener, such as a bolt or a screw, which may be metallic.

According to any arrangement, the mounting fixture may comprise an electrically conductive raft fastener. The electrically conductive raft fastener may pass through (for example entirely through) the electrical raft, for example from an upper major surface to a lower major surface. One end of the electrically conductive raft fastener may be in electrical contact with the electrically conductive screen layer. Such electrical contact may be direct electrical contact and/or may be via another component, such as a washer. The electrically conductive screen layer may be exposed at the surface of the electrical raft in the region in which it is electrically connected to the electrically conductive raft fastener. Another end of the conductive raft fastener may extend through the electrical raft for connection with the mounting structure of an apparatus.

Any suitable material may be used for the rigid material of the electrical raft. For example, the rigid material may be a rigid composite material, for example an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraftouroethylene), PAEK (polyaryletherketone), polyurethane, and/or polyamides (such as nylon).

In any example of electrical raft or electrical raft assembly, at least one of the electrical conductors embedded in the electrical raft may be an electrically conductive wire. The or each electrically conductive wire may be surrounded by an electrically insulating sleeve. Electrical screening need not be provided to individual wires, because this is provided in the electrical raft by the electrically conductive screen layer (at least to some, if not all, of the electrical conductors). As such, individual wires may be laid into (or embedded in) the electrical raft, and each wire may be used to transfer one or more electrical signals through the raft and around the engine. Providing a sleeve to the individual wires may provide extra mechanical and/or electrical protection/isolation.

At least some (for example a plurality) of the electrical conductors may be provided in a flexible printed circuit (FPC). Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with one or more electrical wires embedded therein (which may be sheathed) and/or one or more flexible printed circuits embedded therein. As such, a given electrical raft may have wires and flexible printed circuits laid therein.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors may be said to be surrounded by the rigid material and/or buried in the rigid material and/or integral with (or integrated into) the rigid material.

An electrical raft assembly described above and elsewhere herein may be a part of an apparatus. Any such electrical raft assembly described and/or claimed herein may be a part of such an apparatus. Such an apparatus may comprise a mounting structure for connecting the electrical raft assembly to the rest of the apparatus. The mounting fixture of the electrical raft assembly may be mechanically and electrically connected to the mounting structure of the apparatus. This may electrically connect the electrically conductive screen layer of the electrical raft to the rest of the apparatus. Thus, the electrically conductive screen layer may be said to be "grounded" to the other apparatus.

Such an apparatus may be a gas turbine engine, a gas turbine engine installation, or a part thereof. The electrical raft (or electrical raft assembly) may be at least a part of an electrical harness, for example for a gas turbine engine, and thus may be referred to herein as an electrical harness raft (or electrical harness raft assembly).

There is also provided a method of assembling an electrical raft assembly and/or a gas turbine engine. The method comprises preparing an electrical raft assembly as described above and elsewhere herein. The method also comprises electrically and mechanically connecting the prepared electrical raft assembly to the rest of the apparatus/gas turbine engine by fastening the mounting fixture of the electrical raft assembly to the mounting structure of the apparatus/gas turbine engine.

Thus, according to an aspect, there is provided a gas turbine engine or gas turbine engine installation (for example for an airframe) comprising an electrical raft and/or an electrical raft assembly as described above and elsewhere herein. For example, at least one electrical raft and/or electrical raft assembly may be used as part of an electrical harness for transferring electrical signals around the engine, in the form of electrical harness raft(s) and/or electrical harness raft assemblies.

In such a gas turbine engine, the electrical raft assembly may be a first engine installation component, and the gas turbine engine may further comprise a second engine installation component having electrical conductors. The gas turbine engine may further comprise at least one flexible cable connected between the electrical raft assembly and the second engine installation component so as to electrically connect electrical conductors of the electrical raft assembly with electrical conductors of the second engine installation component. The second engine installation component may be, for example, an ECU, such as an EMU or EEC. Additionally or alternatively, the second engine installation component may be a further electrical raft or electrical raft assembly.

The environment of a gas turbine engine during operation may be particularly severe, with, for example, high levels of vibration and/or differential expansion between components as the temperature changes through operation and as the components move relative to each other. Providing at least one flexible cable to connect an electrical raft assembly to another component may allow the electrical rafts and/or components to accommodate vibration and/or relative movement, for example of the component(s)/assemblies to which they are attached/mounted during use. For example, the flexible cable(s) (where present) used to electrically connect electrical raft assemblies to other component(s) may have sufficient length to accommodate such vibration and/or movement during use.

For example, providing separate (for example more than one) electrical raft assemblies and connecting at least some (for example at least two) of them together using at least one flexible cable may allow the electrical rafts to accommodate vibration and/or relative movement of the component(s)/assemblies to which they are attached/mounted during use.

Use of one or more electrical raft assemblies may significantly reduce build time of an engine. For example, use of electrical raft assemblies may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. Connection between the rafts and other electrical components using the flexible cable(s) may be particularly convenient and straightforward. Thus, use of electrical raft assemblies in a gas turbine installation may reduce assembly time and/or reduce the possibility of errors occurring during assembly.

Use of electrical raft assemblies may provide significant advantages during maintenance, such as repair and overhaul. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional harnesses. Use of electrical rafts (for example as part of one or more electrical raft assemblies) may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts and/or electrical raft assemblies prior to engine assembly. This may allow the electrical and/or mechanical operation of the electrical rafts to be proven before installation, thereby reducing/eliminating the testing required during engine installation.

Accordingly, there is provided (and aspects of the invention may be used with/as a part of) a method of servicing a gas turbine engine, the method comprising: removing a first rigid raft assembly from the gas turbine engine, the rigid raft assembly incorporating at least a part of at least one component or system of the gas turbine engine; and installing a second, pre-prepared, rigid raft assembly onto the gas turbine engine in place of the first raft assembly. The first and second rigid raft assemblies may be electrical raft assemblies having electrical conductors embedded in a rigid material. The electrical conductors may be at least a part of an electrical system arranged to transfer electrical signals around the engine.

The electrical rafts/electrical raft assemblies may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires and/or insulating sleeves, including a number of dedicated electrical screens, would be required. The reduced weight may be particularly advantageous, for example, when used on gas turbine engines on aircraft.

Electrical rafts may be more easily packaged and/or more compact, for example than conventional harnesses. Indeed, as mentioned above, the electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft assembly is attached, such as a fan casing or a core casing.

The electrical raft(s) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

It will be appreciated that the electrical signals transferred by the conductors in the electrical raft, and around the engine using the electrical rafts/raft assemblies may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine installation or a related (for example electrically and/or mechanically connected) structure/component/system.

An electrical raft or raft assembly may be provided in any suitable location/position of the gas turbine engine, for example to a mounting structure at any suitable location. For example, the gas turbine engine may comprise a bypass flow duct formed between an engine core and an engine fan casing (the gas turbine engine may be a turbofan engine, for example); and the electrical raft assembly may form at least a part of a radially extending splitter (which may be referred to as a bifurcation) that extends across the bypass flow duct. In this way, an electrical raft (which may be referred to as a splitter electrical raft) may provide an electrical connection between a fan casing and an engine core. By way of further example, the electrical raft assembly may be attached to the engine core case or engine fan case, for example to a mounting structure on such cases.

An electrical raft may have components and/or parts of other systems embedded therein, such as fluid passages (or pipes) that may form a part of a fluid system, for example for carrying a gas (such as cooling air, sealing air, and/or muscle air (for example for pneumatic systems)) and/or a liquid (such as fuel, water, oil and/or hydraulic fluid). Accordingly, there is provided (and aspects of the invention may be used with/as a part of) a rigid raft assembly for a gas turbine engine, the rigid raft assembly comprising a rigid material that carries at least a part of a first gas turbine engine system and at least a part of a second gas turbine engine system, wherein: the first gas turbine engine system is a fluid system that comprises at least one fluid passage that is at least partially embedded in the rigid raft assembly. The second gas turbine engine system may be an electrical system that comprises electrical conductors at least partially embedded in the rigid material. Thus the rigid raft assembly may be an electrical rigid is raft assembly.

Other components/systems of a gas turbine engine may be provided to an electrical raft assembly in any suitable manner. For example, such other components/systems may be mounted on one or more electrical raft assemblies. Thus, a surface of an electrical harness raft may be used as a mounting surface for other gas turbine engine components/systems, such as ancillary/auxiliary components/systems.

An electrical raft may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to the electrical rafts (for example mechanically mounted using a bracket), and thus to the engine. The fluid pipes may be arranged to carry any fluid as desired, including gas (such as cooling air, sealing air, and/or muscle air (for example for pneumatic systems)) and/or liquid (such as fuel, water, oil and/or hydraulic fluid). Of course, more than one set of fluid pipes, for example for carrying different or the same fluids, may be mounted on the same electrical raft.

Examples of components/systems that may be at least in part mounted to an electrical raft include, by way of non-limitative example: fire detectors and/or fire detection elements; thermocouples for measuring air temperature (for example within a particular engine zone); vibration monitoring processing equipment (for example a signal processing component/box containing electronics used to process a vibration signal that may be measured elsewhere in the engine); equipment for measuring fluid quality (for example a probe for oil debris monitoring may be provided to one or more pipes mounted to the raft, and/or a signal processing box for processing the oil quality measurements may be mounted on the box); and pressure sensors and/or signal is processing equipment, for example for fluid pipes mounted on the rafts. At least some of these components/systems may be in the form of an electrical unit, which may be mounted to the electrical raft assembly so as to be electrically connected to the electrically conductive screen layer, as described above and elsewhere herein.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 1:
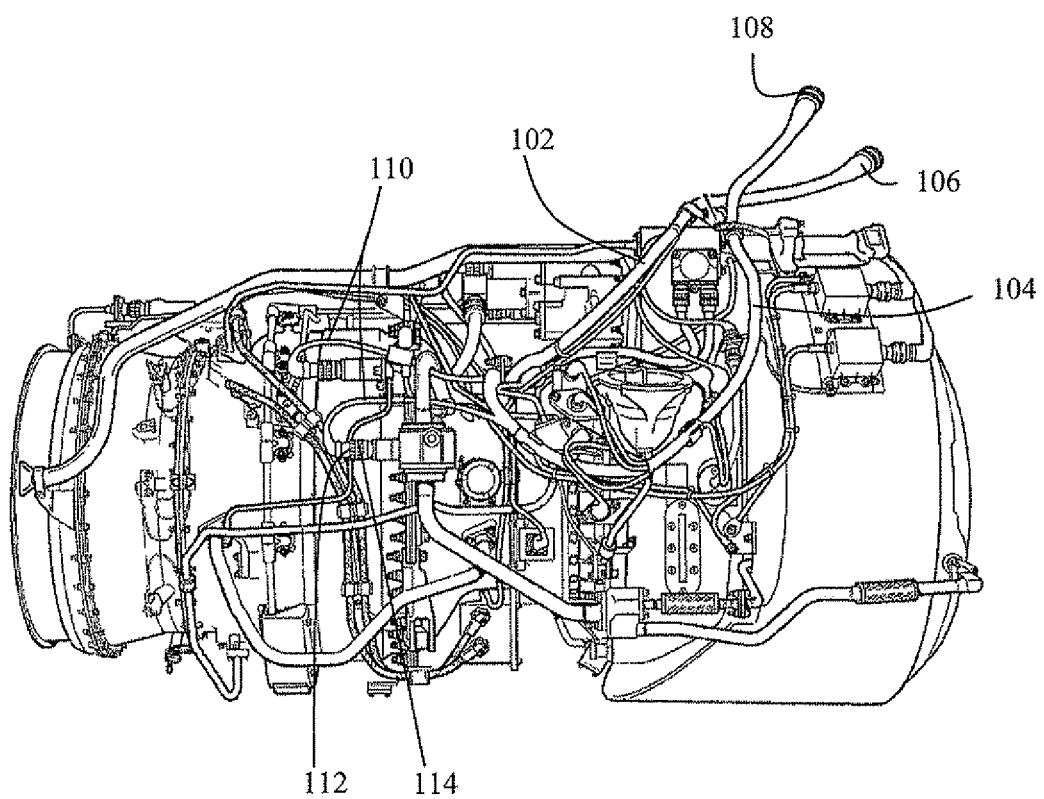
FIG. 1 shows a gas turbine engine with a conventional harness.
Figure 2:
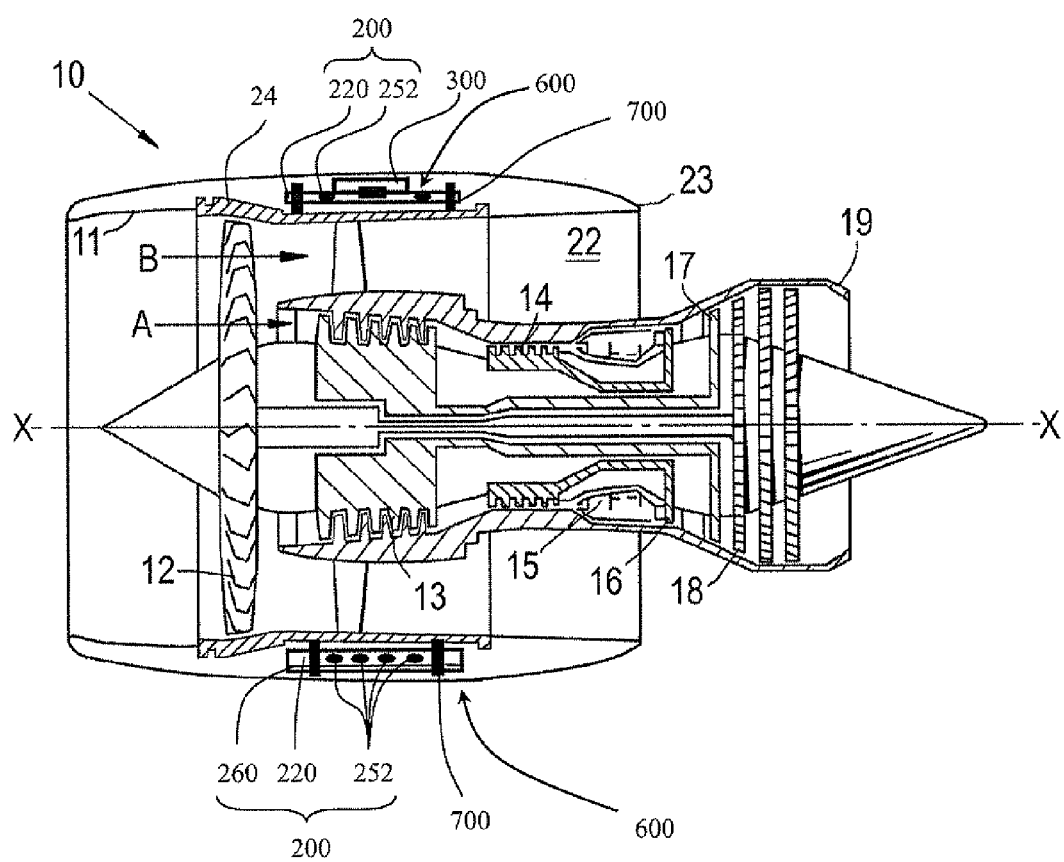
FIG. 2 shows a cross-section through a gas turbine engine having an electrical raft assembly in accordance with the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two electrical raft assemblies 600 according to the present invention. As such, the gas turbine engine 10 is in accordance with the present invention. Each electrical raft assembly 600 comprises an electrical raft 200. The electrical rafts 200 may be used to transmit/transfer electrical signals (or electricity, including electrical power and/or electrical control signals) around the engine and/or to/from the engine 10 from other components, such as components of an airframe. The function and/or construction of each electrical raft 200 and electrical raft assembly 600 may be as described above and elsewhere herein.

In FIG. 2, each electrical raft 200 (which may be referred to herein simply as a raft 200 or an electrical harness raft 200) comprises at least one electrical conductor 252 embedded in a rigid material 220, which may be a rigid composite material. Each electrical raft 200 is also provided with an electrically conductive screen layer 260, although this is only shown and labelled in the lower of the two electrical rafts 200 shown in FIG. 2 for clarity. The electrically conductive screen layer 260 is described in greater detail elsewhere herein, for example in relation to FIGS. 3-6.

Each electrical raft assembly 600 shown in FIG. 2 is provided with a mounting fixture 700. In the FIG. 2 example, the mounting fixture 700 is use to connect the electrical raft assembly 600 to a fan case 24. In other examples, the mounting fixture 700 could be used to connect the electrical raft assembly 600 to any other component. The mounting fixture 700 is described in greater detail elsewhere herein, for example in relation to FIGS. 3-6.

The lower of the two electrical raft assemblies 600 shown in FIG. 2 is provided with an electrical unit 300. The connection of the electrical unit 300 to the electrical raft assembly 600, and in particular the electrical connection of the electrical raft assembly 600 to the electrically conductive screen layer 260 is described in greater detail elsewhere herein, for example in relation to FIGS. 5 and 6.

In some arrangements, the electrical raft 200 (or the electrical raft assembly 600) may be provided with other gas turbine components/systems, such as fluid pipes or conduits forming at least a part of a fluid system. Such fluid pipes may be attached to the electrical raft 200 using mounting brackets. Additionally or alternatively, such fluid pipes may be embedded in the electrical raft 200.

Figure 3:
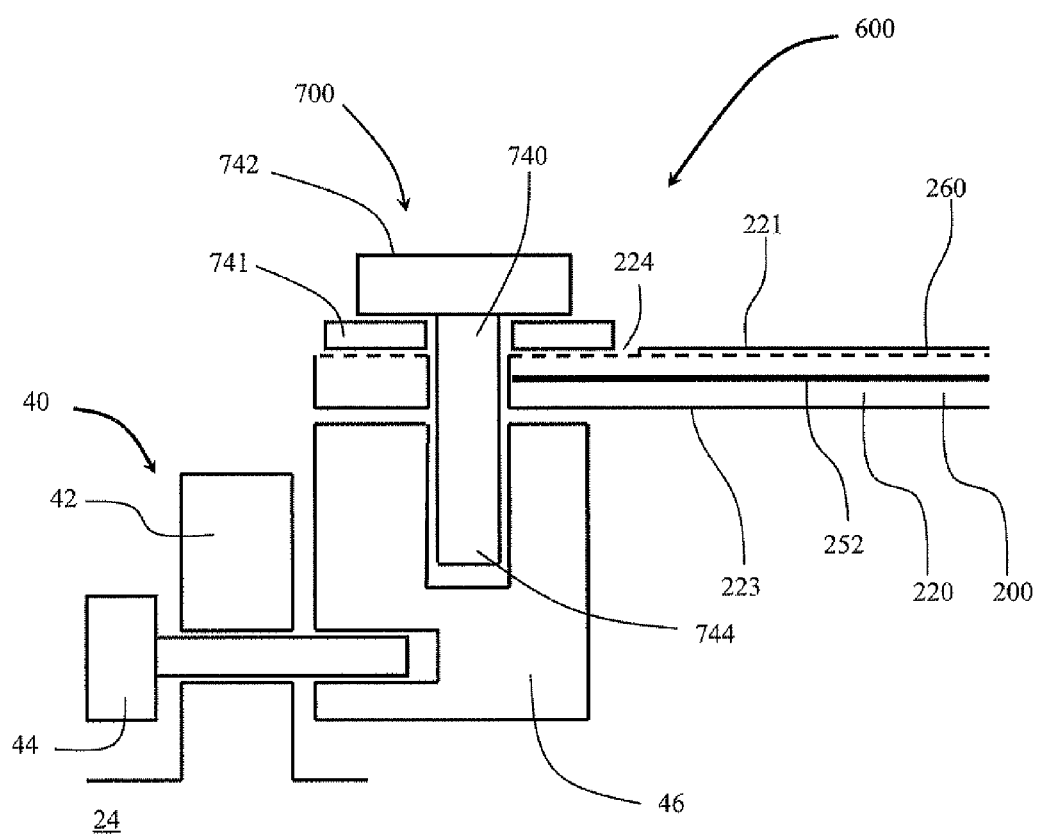
FIG. 3 shows the connection of an electrical raft assembly to another apparatus.

FIG. 3 is a more detailed view of the connection of an electrical raft assembly 600 to a gas turbine engine 10. In the FIG. 3 example, the electrical raft assembly 600 is connected to a fan case 24 of a gas turbine engine 10, but an electrical raft assembly 600 could be alternatively or additionally connected to any other component of a gas turbine engine 10 (or indeed any other apparatus).

In FIG. 3, a mounting fixture 700 comprising an electrically conductive raft fastener 740 is used to connect the electrical raft assembly 600 to the fan case 24. The electrically conductive screen layer 260 is generally embedded in the rigid material 220. However, in the region 224 of the electrically conductive raft fastener 740, the electrically conductive screen layer 260 is exposed to the outside of the rigid material 220. Effectively, in this region 224 the electrically conductive screen layer 260 forms a surface (or an outer surface) of the electrical raft 200. As in FIG. 3, the electrically conductive screen layer 260 may be exposed in this region 224 by removing the material with which it would otherwise have been covered, or by not covering the electrically conductive screen layer 260 during manufacture.

The electrically conductive raft fastener 740 (which may be referred to simply as a raft fastener 740) is in direct contact, or abuts, the electrically conductive screen layer 260 in the exposed region 224. Thus, a first end 742 of the raft fastener 740 is in electrical contact with the electrically conductive screen layer 260 in this region, albeit via an optional washer 741 in the FIG. 3 example. In this regard, and by way of example only, the raft fastener 740 may be a threaded fastener, such as a bolt, and the first end 742 may, for example, be the head of the bolt.

The raft fastener 740 extends through the electrical raft 200, from an upper major surface 221 through a lower major surface 223. As such, a lower, second, end 744 of the raft fastener 740 extends out of the other side of the electrical raft 200, through the lower major surface 223.

The second end 744 of the raft fastener 740 is connected to a mounting structure 40. In FIG. 3, the mounting structure 40 is part of (or provided on) the fan case 24 of a gas turbine engine. In FIG. 3, the mounting structure 40 comprises a flange 42 extending from the fan case 24, and a mounting bracket or mounting block 46. A fastener 44 (which may be a conductive fastener 44) is used to attach the flange 42 to the mounting bracket 46. The mounting bracket 46, which may be said to be a part of the mounting fixture 700, also receives the second end 744 of the raft fastener 740. In this way, the electrical raft assembly 600 is attached to the fan case 24. At least a part of (for example all of, or the surface of) the flange 42, the fastener 44 and the mounting block 46 may be electrically conductive, so as to provide an electrical conduction path from the raft fastener 740 to the fan case 24.

Thus, through the raft fastener 740 and the mounting structure 40, the electrically conductive screen layer 260 is electrically connected to the fan case 24. Thus, the electrically conductive screen layer 260 may be said to be grounded, or "earthed" to the fan case 24. Once again, it will be appreciated that the fan case 24 shown in FIG. 3 could be replaced with any other assembly, for example any other assembly or component of a gas turbine engine 10.

The mounting arrangement (including, for example, the mounting fixture 700 and the mounting structure 40) shown in FIG. 3 is just one of many possible mounting arrangements. Any other suitable mounting arrangement may be used, for example any mounting arrangement that allows electrical conduction between the electrically conductive screen layer 260 and the assembly to which it is mounted (which is a fan case 24 in the FIG. 3 example). For example, the electrically conductive screen layer 260 may be wrapped around the end of the electrical raft 200 to provide additional (or alternative) contact area on the lower surface 223 of the electrical raft 200. This may allow direct electrical connection of the electrically conductive screen layer 260 to the mounting structure 40 without requiring the raft fastener 740, or at least without requiring a conductive raft fastener 740. Alternatively or additionally, another electrically conductive screen layer 260 could be provided on the lower major surface 223, or at least exposed at a portion of the lower major surface 223 in the region of the mounting structure 40. This additional (or alternative) electrically conductive screen layer 260 may be in direct contact with the mounting structure 40. In the event that both an upper and a lower electrically conductive screen layer 260 are provided, they may be connected together using conductive pins.

Figure 4:
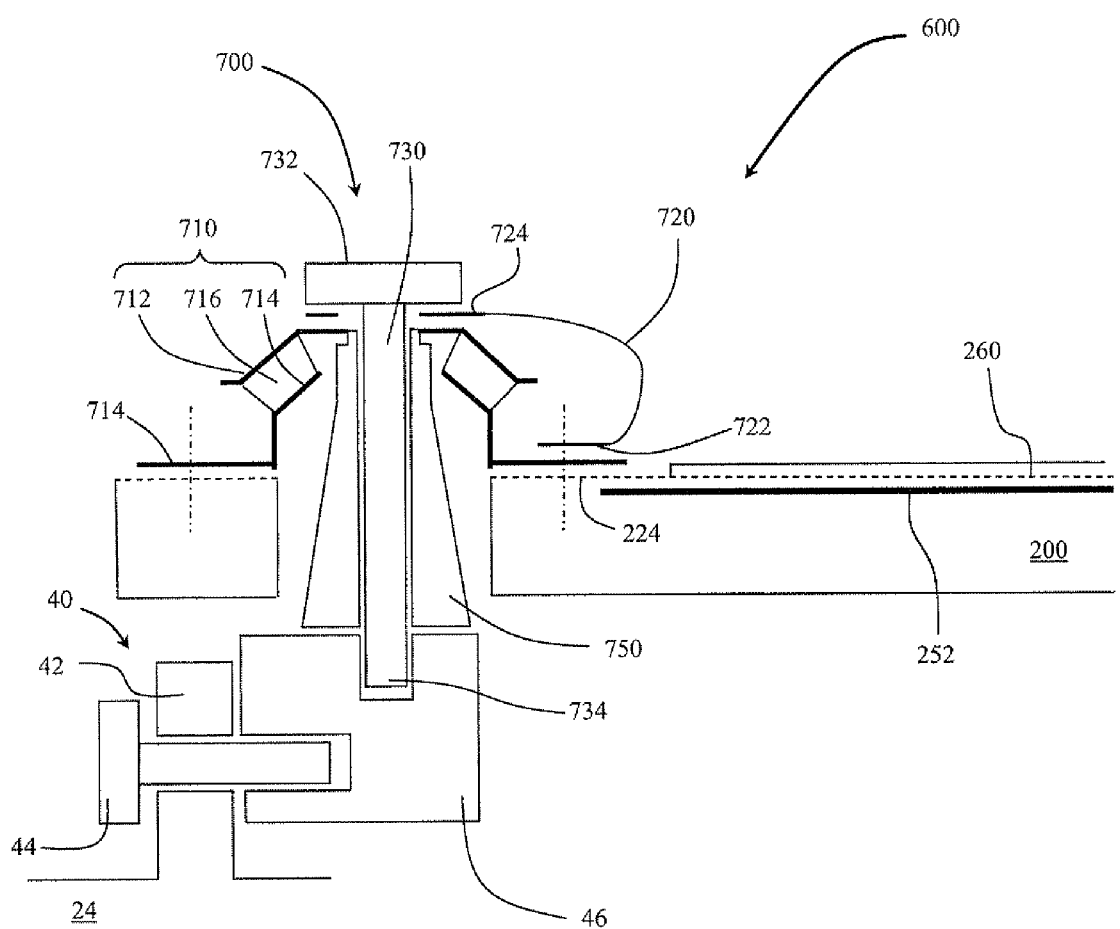
FIG. 4 shows the connection of an electrical raft assembly to another apparatus including an anti-vibration mount.

FIG. 4 shows an example of another arrangement for mounting an electrical raft assembly 600 to an assembly. Again, in the example shown in FIG. 4, the assembly is a fan case 24, but the electrical raft assembly 600 could be mounted to any assembly. Thus, where the description relates to a fan case 24, it will be appreciated that such description could relate to any other component or apparatus, including a mounting structure, for example of a gas turbine engine.

In FIG. 4, the electrical raft assembly 600 is attached to the fan case 24 via an anti-vibration mount 710. Thus, the mounting fixture 700 comprises an anti-vibration mount 710. The anti-vibration mount 710 may take any suitable form. For example, the anti-vibration mount 710 in FIG. 4 comprises a resilient core 716, which may, for example, be elastomeric. Such an elastomeric core may not be electrically conductive.

Thus, in order to electrically connect the electrically conductive screen layer 260 to the mounting structure 40 (and ultimately to the fan case 24), a conductive element may be required to bypass such a non-conductive core 716. In the FIG. 4 arrangement, an electrically conductive strap 720 is used. The electrically conductive strap 720 provides an electrical connection across the resilient core 716. The electrically conductive strap 720 provides an electrical connection from the electrically conductive screen layer 260 to an electrically conductive raft fastener 730. The electrically conductive raft fastener 730 (including the first and second ends 732, 734) may take any suitable form, for example as described above in relation to the raft fastener 740 of FIG. 3 (including its respective first and second ends 742, 744).

The resilient core 716 of an anti-vibration mount 710 may be sandwiched between an upper conductive surface 712 and a lower conductive surface 714 (which may, for example, be metallic), as in the example shown in FIG. 4. One side of the lower conductive surface 714 may be in direct electrical contact with the electrically conductive screen layer 260. This may be achieved by having the electrically conductive screen layer 260 exposed to the surface of the electrical raft 200 in that region 224, as shown in FIG. 4. A first end 722 of the conductive strap 720 may then be attached to the other side of the lower conductive surface 714, as shown in the FIG. 4 arrangement for example, thereby electrically connecting the first end 722 of the conductive strap to the electrically conductive screen layer 260. A second end 724 of the conductive strap 720 may be in contact with the upper conductive surface 712 of the anti-vibration mount 710, as in the FIG. 4 arrangement. Other arrangements may also be suitable, of course. For example, the second end 724 of the conductive strap 720 may be in contact with the electrically conductive raft fastener 740 without also being in contact with an upper conductive surface 712. In such an arrangement, it may not be necessary for the anti-vibration mount 710 to be provided with an upper conductive surface 712.

In other respects, the arrangement shown in FIG. 4 may be substantially similar to that shown in FIG. 3 and as described above. Like features are labelled with the same reference numerals in FIGS. 3 and 4. Thus, for example, the mounting structure 40 of the fan case 24 shown in FIG. 4 may be substantially the same as that described above in relation to FIG. 3. The mounting Fixture 700 of the FIG. 4 arrangement, however, also comprises an optional mounting post 750, arranged to receive and/or guide the raft fastener 730 so that the second end 734 thereof is received by the mounting bracket 46. Of course, other examples may not include such a mounting post 750.

Figure 5:
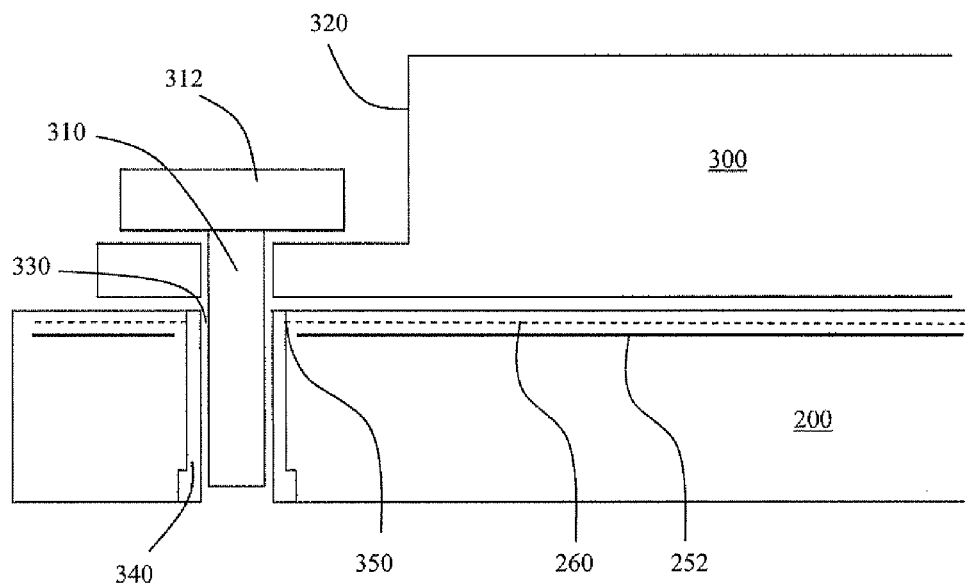
FIG. 5 shows an electrical unit mounted on an electrical raft in an electrical raft assembly.
Figure 6:
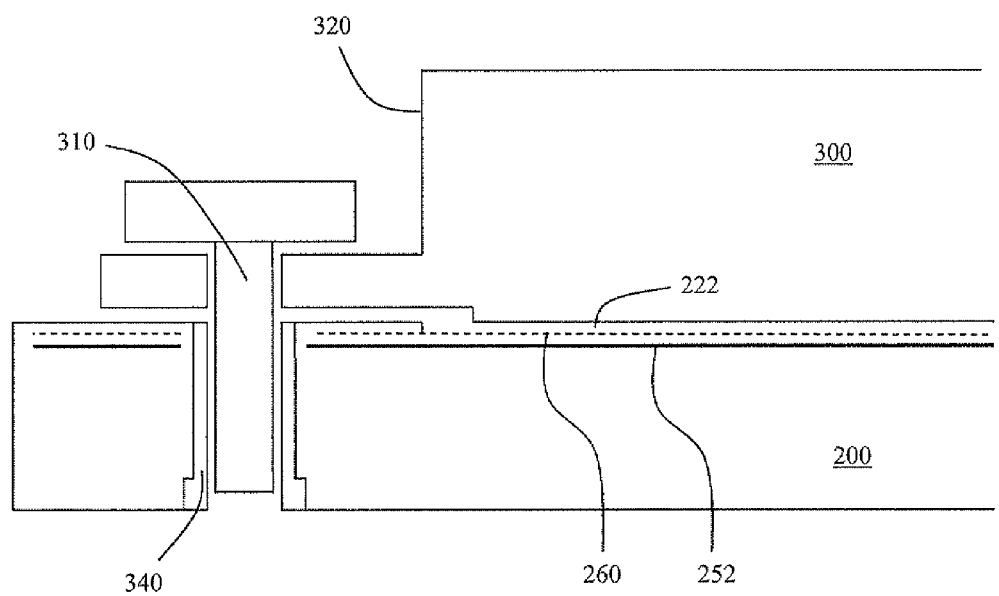
FIG. 6 shows an electrical unit mounted on an electrical raft in an electrical raft assembly.

Both FIG. 5 and FIG. 6 show an electrical raft 200 with an electrical unit 300 mounted thereon. The electrical raft 200 may be part of an electrical assembly 600 that includes a mounting fixture 700, such as those described above by way of example in relation to FIGS. 3 and 4. Thus, although no such mounting fixtures 700 are shown in FIG. 5 (or in FIG. 6), the description and claims herein relating to features of the electrical assembly 600, including the mounting fixture 700, such as those in relation to FIGS. 3 and 4, may also apply to examples in which an electrical unit 300 is mounted to the electrical raft 200, such as described below by way of example in relation to FIGS. 5 and 6.

The FIG. 5 and FIG. 6 arrangements have common features and/or elements, which are given the same reference numbers in both Figures. Any description of such features applies both to the FIG. 5 arrangement and to the FIG. 6 arrangement (and indeed to other arrangements not explicitly shown in the Figures). For example, the electrical conductors 252 are shown both in FIGS. 5 and 6, and indeed in FIGS. 3 and 4. Just one layer of electrical conductors 252 is shown in FIGS. 3-6, but at least one layer of electrical conductors 252 could be provided.

FIG. 5 shows an example of an arrangement for electrically connecting an electrical unit 300 to the electrically conductive screen layer 260 of the electrical raft 200/electrical raft assembly 600. The electrical unit 300 may have a conductive casing 320, meaning that at least a part of the casing may be conductive. For example, at least a part of the casing 320 may be metallic. In FIG. 5, the electrical raft 200 is provided with an opening 330, which takes the form of a passage 330 or hole 330. The opening/hole 330 may pass right through the electrical raft 200, as shown in FIG. 5, or may be a blind hole/opening 330, such that it does not pass all of the way through the electrical raft 200, i.e. it may be closed at one end.

The opening 330 is provided with a conductive insert 340, at least a part of which (for example all of) is electrically conductive. The insert 340 may be electrically connected or joined to the electrically conductive screen layer 260, for example by metallic joining, such as soldering, welding or brazing. An electrically conductive fastener (which may be referred to as an electrically conductive unit fastener) 310 is used to fasten, or fix, the electrical unit 300 to the electrical raft 200. The electrically conductive fastener 310 may be in electrical contact with an electrically conductive part of the casing 320 of the electrical unit 300, for example at one end 312, which may be described as a head 312 of the fastener 310. The electrically conductive fastener 320 may also be in electrical contact with the insert 340. Thus, because the insert 340 is electrically joined to the electrically conductive screen layer 260 at joining position 350, the conductive casing 320 of the electrical unit 300 is electrically connected to the electrically conductive screen layer 260. In this way, the electrically conductive screen layer 260 can act to electrically ground, or earth, the electrical unit 300, and thus to electrically protect the electrical unit 300 (for example the internal circuits of the electrical unit 300). For example, referring back to FIGS. 3 and 4, the electrically conductive screen layer 260 may be electrically connected to another assembly, such as a gas turbine engine component, such as a mounting structure 40 of a fan case 24, thereby grounding, or earthing, the electrical unit 300. This may provide electrical protection to the electrical unit 300 from, for example, surges in voltage, which may be generated by lightning strikes or short circuits, for example.

FIG. 6 shows another arrangement for electrically connecting an electrical unit 300 to an electrical raft 200/electrical raft assembly 600. As mentioned above, like features have the same reference numerals in FIGS. 5 and 6, and indeed in all Figures. In is FIG. 6, the electrically conductive screen layer 260 is exposed at the surface of a region 222 of the electrical raft 200. This exposed region 222 is in direct electrical contact with the electrically conductive casing 320 of the electrical unit 300 when the electrical unit 300 is mounted on the electrical raft 200. In this way, the electrically conductive screen layer 260 can ground, or earth, the electrical unit 300, for example in the manner described in relation to FIG. 5.

The arrangements for connecting the electrical unit 300 to the electrically conductive screen layer 260 shown in FIGS. 5 and 6 could be combined together in a single arrangement, thereby providing two independent grounding routes for a single electrical unit 300. Alternatively, just one of the two arrangements shown in FIGS. 5 and 6 may be employed. If only the grounding arrangement described in relation to FIG. 6 is to be used, then the insert 340 and/or the fastener 310 need not be electrically conductive, and/or the electrically conductive screen layer 260 need not be electrically joined to the insert 340.

As mentioned elsewhere herein, the electrical unit 300 could be any sort of electrical unit 300, for example any sort of electrical unit 300 used in a gas turbine engine. By way of example only, the electrical unit 300 could be an Electronic Control Unit (ECU), such as an Electronic Engine Controller (EEC) and/or an Engine Health Monitoring Unit (EMU). Of course, at least one electronic unit 300 could be mounted on an electrical raft 200 as required.

The electrical conductors 252 in the electrical raft 200 may be provided in a harness 250, which may be a flexible printed circuit board (or FPC) 250. Such an FPC is explained in greater detail elsewhere herein. However, the electrical conductors 252 embedded in the electrical raft 200 may be provided in any suitable way, for example as insulated or non-insulated wires or tracks laid directly into the rigid material 220.

Figure 7:
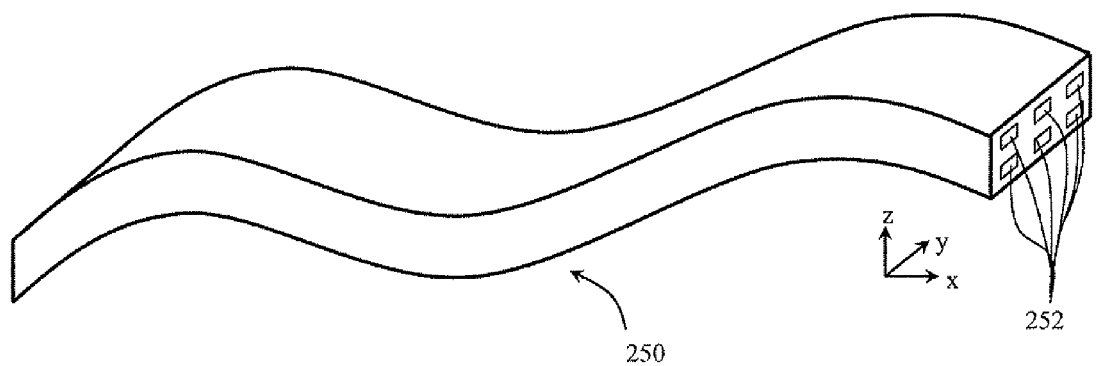
FIG. 7 shows a perspective view of a flexible printed circuit.
Figure 8:
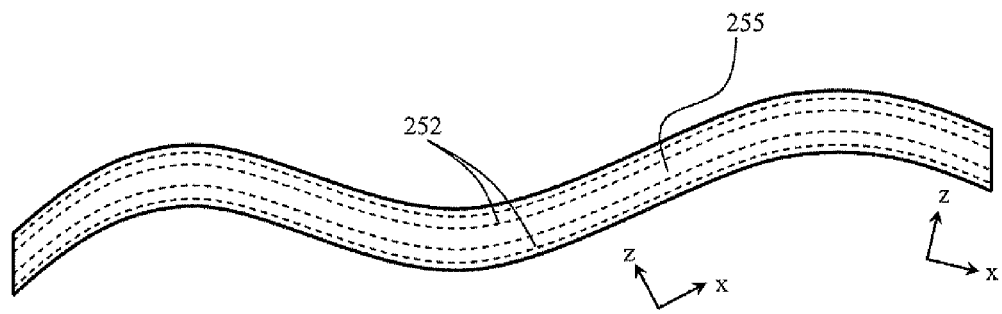
FIG. 8 shows a side view of the flexible printed circuit of FIG. 7.

An example of an FPC 250 in which the electrical conductors 252 may be provided is shown in greater detail in FIGS. 7 and 8. FIG. 7 shows a perspective view of the FPC 250, and FIG. 8 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 7 and 8, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 8. The x-y surface(s) (i.e. the surfaces formed by the x and y directions) may be said to be the major surface(s) of the FPC 250. In the example shown in FIGS. 7 and 8, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 7 and 8 has conductive tracks 252 running through the substrate 255. However, the number of conductive tracks 252 running through a substrate 255 could be fewer than 6, or greater than 6. Indeed the number of conductive tracks 252 could be far greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 7 and 8 comprises 2 layers of tracks, with each layer comprising 3 tracks 252.

An electrical raft 200 as described and claimed herein may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 9:
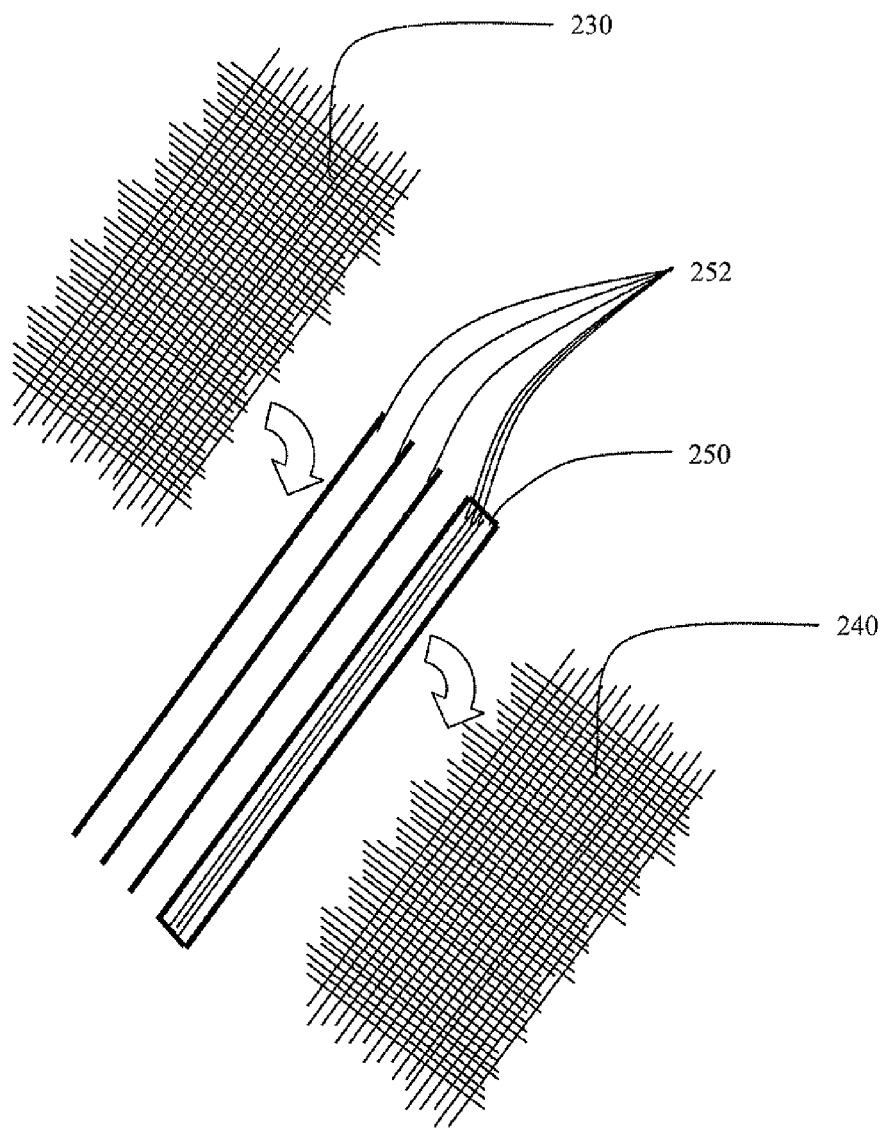
FIG. 9 shows a schematic of an electrical raft prior to assembly.

FIG. 9 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 9, the fibre and resin compound is formed of a sheet of interwoven fibres, or strands. The strands in FIG. 9 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

Any suitable method could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. Indeed, in some constructions no fibre may be used at all in the rigid material 220.

After the treatment, the electrical raft 200 may be set in the desired shape. The mounting fixture 700, and components thereof, may be provided to/formed in the electrical raft 200 at any suitable time during manufacture, for example prior to any stiffening treatment of the rigid raft assembly 200, or after such treatment. For example, a passage or hole to accept a raft fastener 730, 740 could be formed in the electrical raft 200 either during (for example by using a suitable mould shape), or machined after stiffening (for example by drilling). Similarly, any components and/or features required to mount an electrical unit 300 (where provided) on the electrical raft 200 may also be provided/formed during and/or after manufacture of the raft.

Figure 10:
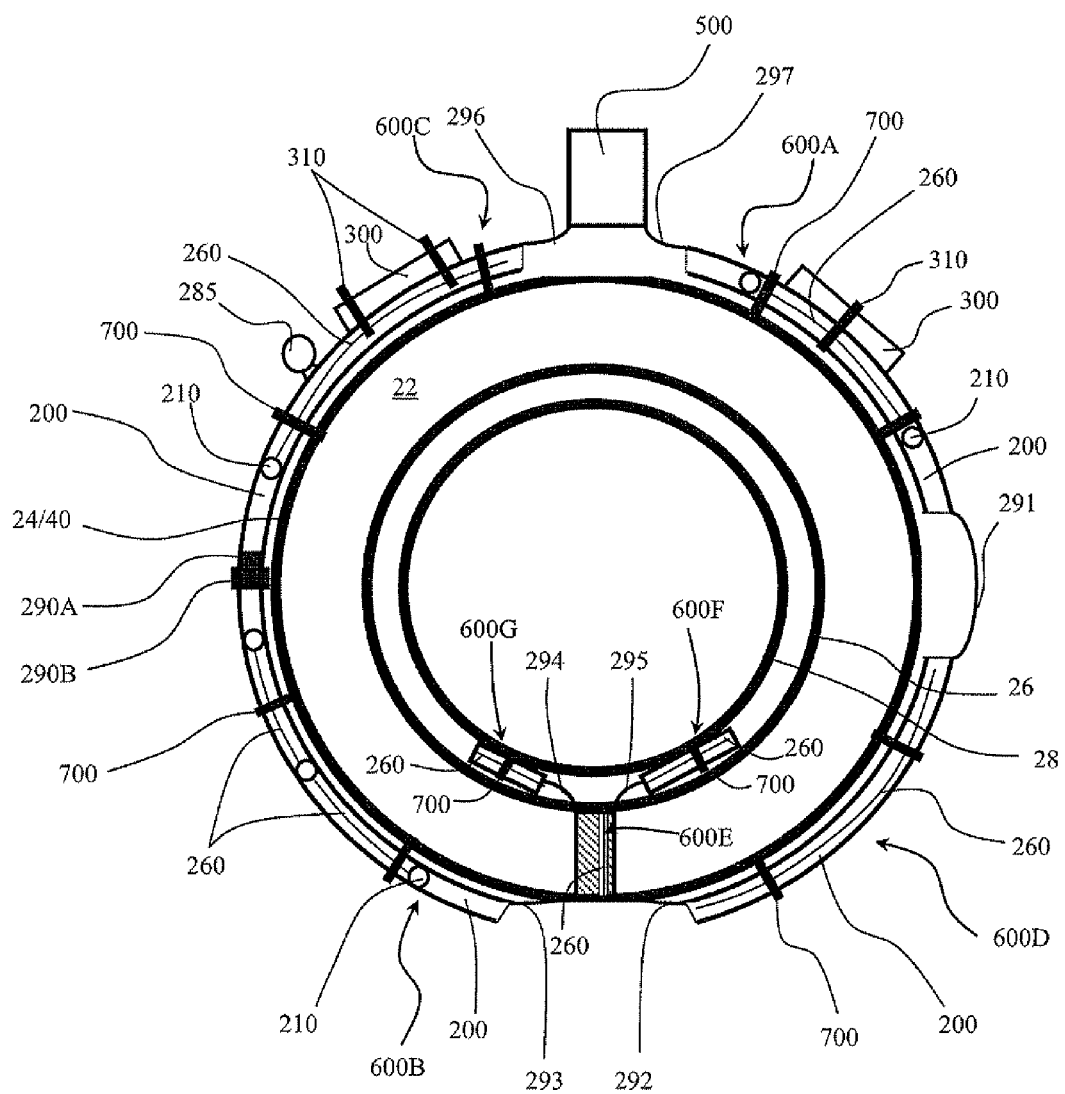
FIG. 10 shows a cross-section normal to the axial direction through a gas turbine engine according to an embodiment of the invention.

FIG. 10 is a schematic showing a cross-section perpendicular to the direction X-X of a gas turbine engine comprising electrical raft assemblies 600A-600G. Any one of the electrical raft assmblies 600A-600G may comprise any or all of the features of an electrical raft assembly 600, for example as described above. Thus, for example, any one of the electrical raft assemblies may comprise an electrical raft 200 (not labelled for raft assemblies 600E-600G for simplicity only) having electrical conductors 252 (not labelled in FIG. 10 for simplicity only) embedded therein and an electrically conductive screen layer 252. Any one of the electrical raft assemblies 600A-600G (which may collectively be referred to as electrical raft assemblies 600) may comprise a mounting fixture 700 (such as those described herein by way of example) for attaching the respective assembly 600 to a mounting structure 40.

The mounting structure 40 is part of a fan case 24 for electrical raft assemblies 600A-600D, part of a bifurcation splitter that radially crosses a bypass duct 22 for electrical raft assemblies 600E and part of an engine core case 28 for electrical raft assemblies 600F and 600G. However, it will be appreciated that an electrical raft assembly 600 could be mounted in any suitable and/or desired location on a gas turbine engine.

In FIG. 10, two electrical raft assemblies 600A, 600C are shown as having an electrical unit 300 mounted on the respective electrical raft 200. However, it will be appreciated that any one or more of the electrical raft assemblies 600A-600G may have an electrical unit 300 mounted the respective electrical raft 200. In order to mount the electrical unit 300 (which may be as described elsewhere herein including, for example, a conductive casing 320) such that it is electrically grounded via the electrically conductive screen layer 262, any suitable method could be used, such as one of those described by way of example herein, for example in relation to FIGS. 5 and 6.

As mentioned above, each of the electrical rafts associated with the electrical raft assemblies 600A-600G shown in FIG. 10 comprises one or more electrical conductors 252 embedded therein. However, any one or more of the electrical rafts 200 may be replaced with a raft that does not comprise electrical conductors 252. Such a raft would not be an electrical raft 200, but may otherwise be as described elsewhere herein, for example it may be a rigid raft that may have components/systems (such as, by way of example only, fluid systems, such as pipes) mounted thereon and/or embedded therein. Thus, for example, a gas turbine engine in accordance with the present invention may have a combination of electrical rafts 200 and non-electrical rafts.

Any one of the electrical raft assemblies 600A-600G may be replaced with a raft assembly that does not have an electrical screen layer 260 and/or a mounting fixture in electrical contact therewith. Such a raft assembly may otherwise be as described herein, for example it may comprise electrical conductors 252 embedded in the rigid material of the raft. Such a raft assembly may be used in combination with electrical raft assemblies 600 in an apparatus, such as a gas turbine engine.

The arrangement of electrical raft assemblies 600A-600G shown in FIG. 10 is by way of example only. Alternative arrangements, for example in terms of number, size, shape and/or positioning, of electrical raft assemblies 600A-600G may be used. For example, there need not be 7 electrical raft assemblies, the assemblies may or may not be connected together, and the rafts could be provided to (for example mounted on, for example using the mounting fixture 700) any one or more components of the gas turbine engine. Purely by way of example only, connection between electrical raft assemblies 600A-600D mounted on the fan casing 24 to the electrical raft assemblies 600F, 600G mounted on the core casing 28 may be provided at least in part by means other than an additional electrical raft assembly 600E, for example using wire conductors with insulating sleeves. By way of further example, one or more electrical raft assemblies 600 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts of the electrical raft assemblies 600A-600G may have a fluid passage 210 embedded therein. The fluid passage 210 may be part of a fluid system, such as a gas (for example pneumatic or cooling gas/air) and/or liquid (for example a fuel, hydraulic and/or lubricant liquid). In the FIG. 10 example, three of the electrical rafts (of electrical raft assemblies 600A, 600B, 600C) comprise a fluid passage 210 at least partially embedded therein. The electrical raft of assembly 600C also has a fluid passage 285 (which may be for any fluid, such as those listed above in relation to embedded passage 210) mounted thereon. Such a mounted fluid passage 285 may be provided to any electrical raft, such as those of electrical raft assemblies 600A-600G shown in FIG. 10. The fluid passages 210, 285 shown in FIG. 10 may be oriented in an axial direction of the engine 10. However, fluid passages may be oriented in any direction, for example axial, radial, circumferential or a combination thereof.

In general, any electrical raft assembly 600 may be provided with and/or may comprise (for example may have mounted on and/or have at least partially embedded therein) at least a part of any component and/or system of a gas turbine engine. Components/systems provided to different raft assemblies 600 may be connected to each other, for example a component mounted on a raft 200 of one raft assembly 600 may be connected (for example directly electrically, mechanically and/or fluidly connected) to one or more components mounted on a raft 200 of another raft assembly 600.

As mentioned above, the mounting fixture 700 may take any suitable form. For example, any one or more of the mounting fixtures 700 may comprise an anti-vibration mount, such as that described by way of example herein in relation to FIG. 4.

Any of the electrical raft assemblies 600A-600G (or the respective electrical rafts 200 thereof) may have any combination of mechanical, electrical and/or fluid connections to one or more (for example 2, 3, 4, 5 or more than 5) other components/systems of the gas turbine engine 10 and/or the rest of the gas turbine engine 10 itself. Examples of such connections are shown in FIG. 10, and described below, but it will be appreciated that a gas turbine engine 10 including electrical raft assemblies 600 may have connections that are different to those show in FIG. 7. For example, electrical raft assemblies 600 (and/or non-electrical rafts) may be connected together (or to other components) using any combination of electrical, fluid and/or mechanical connectors. Thus, any of the electrical connections 290A/290B, 291-297 shown in FIG. 10 may be any combination of electrical, fluid and/or mechanical connection. Alternatively, electrical raft assemblies 600 (and/or non-electrical rafts) may be standalone, and thus may have no connection to other rafts or components.

A connection 291 is shown between the electrical rafts of the assemblies 600A and 600D. The connection 291 may comprise an electrical connection. Such an electrical connection may be flexible and may, for example, take the form of a flexible printed circuit such as the flexible printed circuit 250 shown in FIGS. 7 and 8. Such a flexible electrical connection may be used to electrically connect any electrical raft assembly 600 to any other component, such as another electrical raft assembly 600. A connection 297 (which may be or comprise an electrical connection) is provided between the electrical raft of the assembly 600A and a part of an airframe, or airframe installation 500, which may, for example, be a pylon. Similarly, a fluid and/or mechanical connection 296 may additionally or alternatively be provided between the airframe 500 and another electrical raft of the assembly 600C. As shown in FIG. 10, other electrical and/or fluid connections 292, 293, 294, 295 may be provided between electrical rafts 200 (or assemblies 600) and other components, such as other electrical rafts 200 (or assemblies 600).

A direct connection 290A, 290B may be provided, as shown for example between the electrical rafts of the assemblies 600B and 600C in the FIG. 10 arrangement. Such a direct connection 290A, 2908 may comprise a connector 290A provided on (for example embedded in) one electrical raft 200 connected to a complimentary connector 290B provided on (for example embedded in) another electrical raft 200. Such a direct connection 290A, 290B may, for example, provide fluid and/or electrical connection between the two electrical rafts assemblies 600B, 600C.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term 'gas turbine engine' as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical raft assemblies 600 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

It will be appreciated that many alternative configurations and/or arrangements of electrical raft assemblies 600 and gas turbine engines 10 comprising electrical raft assemblies 600 other than those described herein may fall within the scope of the invention. For example, alternative arrangements of electrical raft assemblies 600 (for example in terms of the arrangement, including number/shape/positioning/constructions, of mounting fixtures 700, the arrangement/shape/positioning/construction of the electrical rafts 200 (including the electrically conductive screen layer 26), the type and/or positioning of components (if any) mounted to/embedded in the electrical rafts 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) rafts and/or raft assemblies and between the electrical (or non-electrical) rafts or raft assemblies and other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. A rigid electrical raft assembly having a rigid electrical raft, the rigid electrical raft assembly comprising:
    a rigid material having multiple electrical conductors embedded therein; and
    an electrically conductive screen layer, wherein:
    the rigid electrical raft assembly further comprises a mounting fixture for attaching the rigid electrical raft assembly to a mounting structure of an apparatus;
    the mounting fixture is in electrical contact with the electrically conductive screen layer;
    the mounting fixture comprises an electrically conductive raft fastner that passes through the rigid electrical raft;
    one end of the electrically conductive raft fastener is in electrical contact with the electrically conductive screen layer; and
    another end of the electrically conductive raft fastener extends through the rigid electrical raft for connection with said mounting structure of said apparatus.

2. The rigid electrical raft assembly according to claim 1, wherein the electrically conductive screen layer is at least partially embedded in the rigid material.

3. The rigid electrical raft assembly according to claim 1, further comprising an electrical unit mounted to the rigid electrical raft, wherein:
    the electrical unit has a casing, at least part of the casing being electrically conductive; and
    the casing of the electrical unit is electrically connected to the electrically conductive screening layer.

4. The rigid electrical raft assembly according to claim 3, wherein:
    the rigid electrical raft comprises an electrical contact region at which the electrically conductive screen layer is exposed at a surface of the rigid electrical raft; and
    the electrical unit is mounted to the rigid electrical raft such that an electrically conductive portion of the casing is in direct contact with the electrically conductive screen layer at the electrical contact region.

5. The rigid electrical raft assembly according to claim 3, wherein:
    the rigid electrical raft comprises an opening having an electrically conductive insert;
    the electrically conductive insert is electrically joined to the electrically conductive screen layer; and
    the electrical unit is mounted to the rigid electrical raft using an electrically conductive fastener that engages with an electrically conductive portion of the casing and is inserted into the opening so as to be in electrical contact with the electrically conductive insert.

6. The rigid electrical raft assembly according to claim 5, wherein the electrically conductive insert is a threaded insert, and the electrically conductive fastener is a corresponding threaded fastener.

7. The rigid electrical raft assembly according to claim 1, wherein the mounting fixture comprises:
an anti-vibration mount; and
a conductive strap fixed across the anti-vibration mount so as to provide electrical connection across the anti-vibration mount.

8. The rigid electrical raft assembly according to claim 7, wherein:
the anti-vibration mount comprises a resilient core sandwiched between upper and lower conductive surfaces;
a first end of the conductive strap is in electrical contact with a lower conductive surface of the anti-vibration mount, the anti-vibration mount being in electrical contact with the electrically conductive screen layer; and
a second end of the conductive strap is in electrical contact with an upper conductive surface of the anti-vibration mount.

9. The rigid electrical raft assembly according to claim 8, wherein:
the mounting fixture comprises an electrically conductive raft fastener that passes through the rigid electrical raft;
one end of the electrically conductive raft fastener is in electrical contact with the second end of the conductive strap; and
another end of the electrically conductive raft fastener extends through the rigid electrical raft for connection with said mounting structure of said apparatus.

10. The rigid electrical raft assembly according to claim 1, wherein the rigid material is a rigid composite material.

11. An apparatus comprising:
the rigid electrical raft assembly according to claim 1; and
said mounting structure for connecting the rigid electrical raft assembly to a remaining portion of the apparatus, wherein:
the mounting fixture of the rigid electrical raft assembly is mechanically and electrically connected to the mounting structure of the apparatus, thereby electrically connecting the electrically conductive screen layer to the remaining portion of the apparatus.

12. A gas turbine engine comprising the apparatus of claim 11.

13. The gas turbine engine according to claim 12, wherein the rigid electrical raft assembly is a first engine installation component, and the gas turbine engine further comprises:
a second engine installation component having electrical conductors; and
at least one flexible cable connected between the rigid electrical raft assembly and the second engine installation component so as to electrically connect electrical conductors of the rigid electrical raft assembly with electrical conductors of the second engine installation component.

14. A method of assembling the apparatus according to claim 11, the method comprising:
preparing the rigid electrical raft assembly, and
electrically and mechanically connecting the prepared rigid electrical raft assembly to the remaining portion of the apparatus/gas turbine engine by fastening the mounting fixture of the rigid electrical raft assembly to the mounting structure of the apparatus/gas turbine engine.

15. A rigid electrical raft assembly having a rigid electrical raft, the rigid electrical raft assembly comprising:
a rigid material having multiple electrical conductors embedded therein;
an electrical unit mounted to the rigid electrical raft; and
an electrically conductive screen layer, wherein:
the rigid electrical raft assembly further comprises a mounting fixture for attaching the rigid electrical raft assembly to a mounting structure of an apparatus;
the mounting fixture is in electrical contact with the electrically conductive screen layer,
the electrical unit has a casing, at least part of the casing being electrically conductive, and
the casing of the electrical unit is electrically connected to the electrically conductive screening layer.

16. The rigid electrical raft assembly according to claim 15, wherein:
the rigid electrical raft comprises an electrical contact region at which the electrically conductive screen layer is exposed at a surface of the rigid electrical raft; and
the electrical unit is mounted to the rigid electrical raft such that an electrically conductive portion of the casing is in direct contact with the electrically conductive screen layer at the electrical contact region.

17. The rigid electrical raft assembly according to claim 15, wherein:
the rigid electrical raft comprises an opening having an electrically conductive insert;
the electrically conductive insert is electrically joined to the electrically conductive screen layer; and
the electrical unit is mounted to the rigid electrical raft using an electrically conductive fastener that engages with an electrically conductive portion of the casing and is inserted into the opening so as to be in electrical contact with the electrically conductive insert.

18. The rigid electrical raft assembly according to claim 17, wherein the electrically conductive insert is a threaded insert, and the electrically conductive fastener is a corresponding threaded fastener.

19. An apparatus comprising:
the rigid electrical raft assembly according to claim 15; and
said mounting structure for connecting the rigid electrical raft assembly to a remaining portion of the apparatus, wherein:
the mounting fixture of the rigid electrical raft assembly is mechanically and electrically connected to the mounting structure of the apparatus, thereby electrically connecting the electrically conductive screen layer to the remaining portion of the apparatus.

20. A gas turbine engine comprising the apparatus of claim 19.

* * * * *